(12) United States Patent
Kim et al.

(10) Patent No.: US 8,174,839 B2
(45) Date of Patent: May 8, 2012

(54) MOUNTING STRUCTURE OF SEMICONDUCTOR PACKAGE AND PLASMA DISPLAY DEVICE HAVING THE SAME

(75) Inventors: Dae-Young Kim, Suwon-si (KR); Jang-Ho Moon, Suwon-si (KR)

(73) Assignee: Samsung SDI Co., Ltd., Gongse-dong, Giheung-gu, Yongin-si, Gyeonggi-do (KR)

( * ) Notice: Subject to any disclaimer, the term of this patent is extended or adjusted under 35 U.S.C. 154(b) by 290 days.

(21) Appl. No.: 12/654,154

(22) Filed: Dec. 11, 2009

(65) Prior Publication Data

US 2010/0165594 A1    Jul. 1, 2010

(30) Foreign Application Priority Data

Dec. 31, 2008    (KR) .................. 10-2008-0138246

(51) Int. Cl.
*H05K 7/00*    (2006.01)
(52) U.S. Cl. ........ 361/760; 174/254; 174/255; 174/260; 174/50.52; 174/50.53; 174/50.54; 439/77
(58) Field of Classification Search .................. 361/760; 439/77; 174/254–255, 260–261, 50.52–50.55
See application file for complete search history.

(56) References Cited

U.S. PATENT DOCUMENTS

| 5,043,534 | A | 8/1991 | Mahulikar et al. | |
|---|---|---|---|---|
| 6,395,999 | B1 * | 5/2002 | Ploix | 174/260 |
| 6,972,963 | B1 | 12/2005 | Chou | |
| 7,679,922 | B2 * | 3/2010 | Miyata | 361/749 |
| 7,929,312 | B2 * | 4/2011 | Tamura | 361/760 |
| 2006/0091507 | A1 | 5/2006 | Fjelstad et al. | |
| 2006/0157827 | A1 | 7/2006 | Tanaka et al. | |
| 2007/0023921 | A1 | 2/2007 | Zingher et al. | |
| 2007/0045829 | A1 | 3/2007 | Jeong et al. | |
| 2007/0096160 | A1 | 5/2007 | Beroz et al. | |
| 2007/0290302 | A1 | 12/2007 | Nakagawa et al. | |
| 2008/0024714 | A1 | 1/2008 | Park | |

(Continued)

FOREIGN PATENT DOCUMENTS

EP    1377142 A2    1/2004

(Continued)

OTHER PUBLICATIONS

The Extended European Search Report issued by the European Patent Office on Oct. 6, 2011, corresponding to European Application No. 09180846.9 attached herwith.

(Continued)

*Primary Examiner* — Yuriy Semenenko
*Assistant Examiner* — Andargie M Aychillhum
(74) *Attorney, Agent, or Firm* — Robert E. Bushnell, Esq.

(57) ABSTRACT

A mounting structure of a semiconductor package includes a semiconductor package, a chassis having a coupling boss protruding at a position corresponding to the coupling hole, a coupling member penetrating the coupling hole and coupled to the coupling boss, and an insulation member covering around the coupling hole of the reinforcing plate and making insulation contact with the coupling member and the coupling boss. The semiconductor package includes a film substrate for interfacing transmission of signals between a circuit board and a display panel, a semiconductor chip forming an electrical contact point with the film substrate, and a reinforcing plate to which the film substrate and the semiconductor chip are directly attached. The reinforcing plate has a coupling hole.

20 Claims, 6 Drawing Sheets

U.S. PATENT DOCUMENTS

| | | |
|---|---|---|
| 2008/0136016 A1 | 6/2008 | Hess et al. |
| 2008/0230878 A1 | 9/2008 | Lu et al. |
| 2008/0237856 A1 | 10/2008 | Hisada et al. |
| 2008/0258290 A1 | 10/2008 | Nakajima |
| 2008/0308912 A1 | 12/2008 | Cha et al. |
| 2009/0051045 A1 | 2/2009 | Mun et al. |

FOREIGN PATENT DOCUMENTS

| | | |
|---|---|---|
| JP | 10282895 | 10/1998 |
| JP | 2004-21000 | 1/2004 |
| JP | 2005-191188 | 7/2005 |
| KR | 0416144 | 1/2004 |
| KR | 10-2006-0125225 | 12/2006 |
| KR | 0683718 | 2/2007 |
| KR | 10-2007-0048849 | 5/2007 |
| KR | 2008-105543 | 12/2008 |

OTHER PUBLICATIONS

Korean Office Action dated Oct. 8, 2010 issued by the Korean Patent Office corresponding to Korean Patent Application No. 10-2008-0138246, together with a Request for Entry.

Korean Office Action dated Oct. 8, 2010 issued by the KIPO, No. 10-2008-0138245.

European Office Action issued by European Patent Office, dated Mar. 10, 2011, corresponding to European Patent Application No. 09 180 851.9-1235, which was cited in the Cross-Referenced U.S. Appl. No. 12/654,171.

* cited by examiner

MOUNTING STRUCTURE OF SEMICONDUCTOR PACKAGE AND PLASMA DISPLAY DEVICE HAVING THE SAME

CLAIM OF PRIORITY

This application makes reference to, incorporates the same herein, and claims all benefits accruing under 35 U.S.C. §119 from an application earlier filed in the Korean Intellectual Property Office on 31 Dec. 2008 and there duly assigned Ser. No. 10-2008-0138246.

BACKGROUND OF THE INVENTION

1. Field of the Invention

An embodiment of the present invention relates to a mounting structure of a semiconductor package and a plasma display device having the same.

2. Description of the Related Art

Whereas the size of a semiconductor package has gradually decreased, a degree of integration has increased. As performance of a semiconductor chip improves, the shape of the semiconductor package varies in diverse ways. A conventional chip on film (COF) semiconductor package is a package in which at least one semiconductor chip is mounted on a film type flexible substrate on which a signal wiring is formed. The COF semiconductor package is flexible so as to have a bent shape, has a simple structure without a printed circuit board (PCB), can be manufactured to be light and slim at a low cost, and is suitable for making a fine pitch between leads. Accordingly, the COF semiconductor package has been widely used due to the above advantages.

As an example, the COF semiconductor package may be applied to a plasma display device. In general, the plasma display device is a display device for forming a predetermined image by using gas discharge. For example, the plasma display device has a display panel as an image display unit. The display panel includes a plurality of display cells arranged in a matrix pattern and a plurality of discharge electrodes generating discharge in each of the display cells. The COF semiconductor package may be interposed between the display panel and a circuit substrate as a signal generation source to convert a drive signal and transfer signals.

SUMMARY OF THE INVENTION

The present invention provides a mounting structure of a semiconductor package which guarantees insulative assembly suitable for a semiconductor package having a structure to provide self-floating ground, and a plasma display device having the mounting structure.

According to an aspect of the present invention, there is provided a mounting structure of a semiconductor package including a semiconductor package, a chassis having a coupling boss protruding at a position corresponding to the coupling hole, a coupling member penetrating the coupling hole and coupled to the coupling boss, and an insulation member covering around the coupling hole of the reinforcing plate and making insulation contact with the coupling member and the coupling boss. The semiconductor package includes a reinforcing plate having a coupling hole, a film substrate directly attached to the reinforcing plate and for interfacing transmission of signals between a circuit board and a display panel, and a semiconductor chip directly attached to the reinforcing plate and forming an electrical contact point with the film substrate.

The insulation member may cover around the coupling hole on a surface of the reinforcing plate. The insulation member may extend from a surface of the reinforcing plate in a direction along a thickness of the reinforcing plate and surround an inner wall of the coupling hole. The insulation member may be a hollow member having a sectional shape of a hollow I-shape.

The reinforcing plate may provide floating ground of the semiconductor chip and function as a heat dissipation plate of the semiconductor chip.

According to another aspect of the present invention, there is provided a mounting structure of a semiconductor package including a semiconductor package, a chassis having a coupling boss protruding at a position corresponding to the coupling hole, and a coupling member penetrating the coupling hole and coupled to the coupling boss. The semiconductor package includes a reinforcing plate, a film substrate directly attached to the reinforcing plate and for interfacing transmission of signals between a circuit board and a display panel, a semiconductor chip directly attached to the reinforcing plate forming an electrical contact point with the film substrate. The reinforcing plate includes a first metal layer, a second metal layer, and an insulation substrate disposed between the first and second metal layers. The insulation substrate has a coupling hole.

A plurality of via holes may be formed in the insulation substrate and each of the via holes may be filled with a conductive filler connecting the first and second metal layers on both surfaces of the insulation substrate.

The reinforcing plate and the circuit board may be arranged to overlap each other such that the coupling hole of the reinforcing plate and a coupling hole formed on the circuit board are aligned to the same coupling boss of the chassis, and fixed together by using the coupling member penetrating each of the coupling holes and coupled to the coupling boss.

The reinforcing plate and the circuit board arranged to overlap each other may form a signal transfer line through a conductive contact portion. The first or second metal layer of the reinforcing plate and the exposed wiring of the circuit board may make conductive contact with each other.

According to another aspect of the present invention, there is provided a plasma display device including a plasma display panel forming an image by using gas discharge, at least one circuit board generating a drive signal for the plasma display panel, a semiconductor package, a chassis having a coupling boss protruding at a position corresponding to the coupling hole, a coupling member penetrating the coupling hole and coupled to the coupling boss, and an insulation member covering around the coupling hole of the reinforcing plate and making insulation contact with the coupling member and the coupling boss. The semiconductor package includes a reinforcing plate having a coupling hole, a film substrate directly attached to the reinforcing plate and for interfacing transmission of signals between a circuit board and a display panel, and a semiconductor chip directly attached to the reinforcing plate and forming an electrical contact point with the film substrate.

The insulation member may cover around the coupling hole on a surface of the reinforcing plate. The insulation member may extend from a surface of the reinforcing plate in a direction along a thickness of the reinforcing plate and surround an inner wall of the coupling hole. The insulation member may be a hollow member having a sectional shape of a hollow I-shape.

The reinforcing plate may provide floating ground of the semiconductor chip and function as a heat dissipation plate of the semiconductor chip.

According to another aspect of the present invention, there is provided a plasma display device including a plasma display panel forming an image by using gas discharge, at least one circuit board generating a drive signal for the plasma display panel, a semiconductor package, a chassis having a coupling boss protruding at a position corresponding to the coupling hole, and a coupling member penetrating the coupling hole and coupled to the coupling boss. The semiconductor package includes a reinforcing plate, a film substrate directly attached to the reinforcing plate and for interfacing transmission of signals between a circuit board and a display panel, a semiconductor chip directly attached to the reinforcing plate forming an electrical contact point with the film substrate. The reinforcing plate includes a first metal layer, a second metal layer, and an insulation substrate disposed between the first and second metal layers. The insulation substrate has a coupling hole.

A plurality of via holes may be formed in the insulation substrate and each of the via holes may be filled with a conductive filler connecting a surface of the insulation substrate and the first and second metal layers on both surfaces of the insulation substrate.

The reinforcing plate and the circuit board may be arranged to overlap each other such that the coupling hole of the reinforcing plate and a coupling hole formed on the circuit board are aligned to the same coupling boss of the chassis, and fixed together by using the coupling member penetrating each of the coupling holes and coupled to the coupling boss.

The reinforcing plate and the circuit board arranged to overlap each other may form a signal transfer line through a conductive contact portion. The first or second metal layer of the reinforcing plate and the exposed wiring of the circuit board may make conductive contact with each other.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
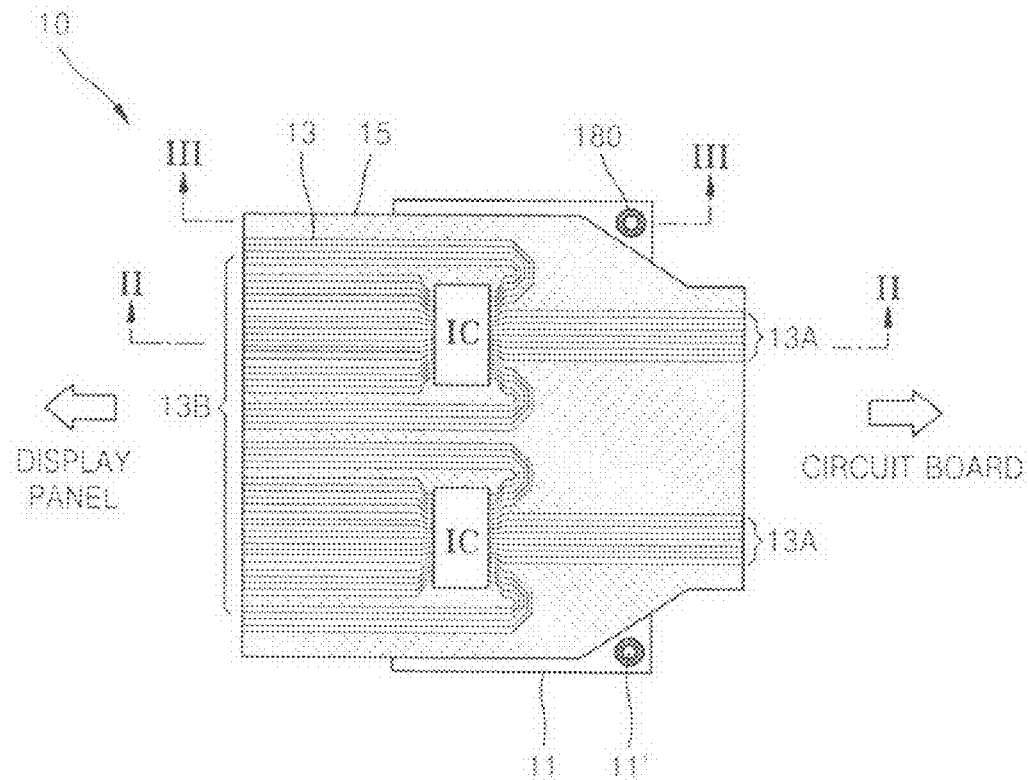
FIG. 1 is a plan view of a COF semiconductor package as an example of a semiconductor package according to an embodiment of the present invention.

FIG. 1 is a plan view of a chip on flex (COF) semiconductor package as an example of a semiconductor package 10 according to an embodiment of the present invention. Referring to FIG. 1, for example, the semiconductor package 10 includes two or more semiconductor chips ICs arranged in parallel and a film substrate 15 providing an I/O wiring of the IC and attached to a reinforcing plate 11. For example, the semiconductor package 10 is interposed between a circuit substrate as a signal generation source and a display panel to convert and transfer signals. In detail, a plurality of conductive patterns 13 extend from the semiconductor chip IC in the opposite directions on the film substrate 15. For example, while the conductive patterns 13 extending in one direction constitute an input wiring 13A for a signal input from a circuit substrate, the conductive patterns 13 extending in the opposite direction constitute an output wiring 13B for a signal output to a display panel. A coupling hole 11' may be formed in at least one corner portion of the reinforcing plate 11. The reinforcing plate 11 may be installed on a chassis (not shown) by using a screw member (not shown) that penetrates the coupling hole 11' and is coupled to the chassis. An insulating member 180 is arranged around the coupling hole 11' in which the screw member is inserted so that the screw member and the reinforcing plate 11 may make insulation contact with each other. This is to prevent electrical short-circuit between the reinforcing plate 11 and the chassis due to the screw member and maintain floating ground provided by the reinforcing plate 11, as described later.

Figure 2:
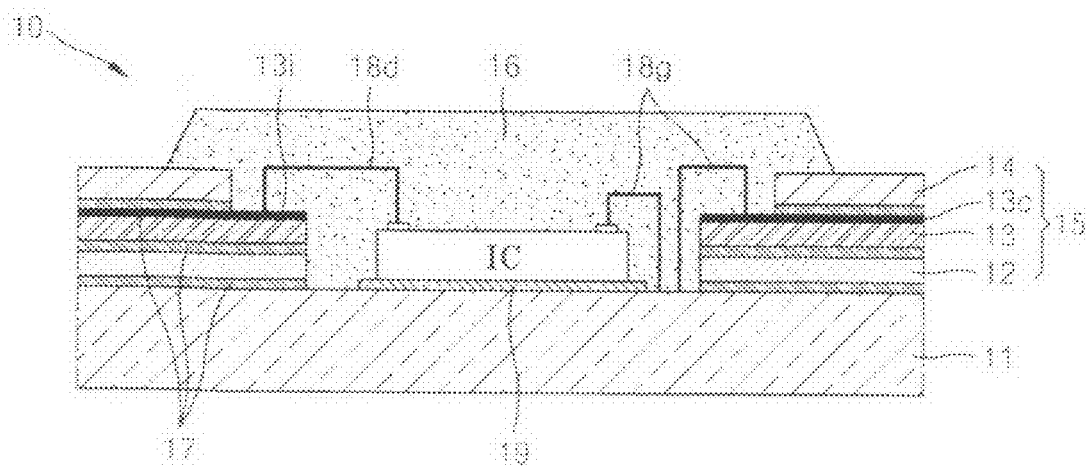
FIG. 2 is a vertical cross-section of the semiconductor package taken along line of FIG. 1.

FIG. 2 is a vertical cross-section of the semiconductor package 10 taken along line II-II of FIG. 1. Referring to FIG. 2, the semiconductor package 10 includes the reinforcing plate 11 as a support structure, the film substrate 15 arranged on the reinforcing plate 11, and the semiconductor chip IC directly mounted on the reinforcing plate 11 and making electrical contact with the film substrate 15. The film substrate 15 has a multilayer structure in which a plurality of functional layers is coupled to each other. In detail, the film substrate 15 includes a base film 12, a conductive pattern 13 formed on the base film 12, and a cover-ray 14 for burying and insulating the conductive pattern 13. An adhesive layer 17 is provided between the respective layers, forming a single multilayer structure.

The reinforcing plate 11 has a function to dissipate heat of the semiconductor chip IC by being thermally coupled to the semiconductor chip IC and simultaneously to provide floating ground to the whole semiconductor package 10. That is, operation heat generated during the operation of the semiconductor chip IC is transferred to the reinforcing plate 11 via a conductive adhesive layer 19 such as silver (Ag) paste provided between the reinforcing plate 11 and the semiconductor chip IC. The heat transferred to the reinforcing plate 11 is dissipated from an outer surface of the reinforcing plate 11 to the outer atmosphere by convective heat transfer. The semiconductor chip IC and the conductive pattern 13, in detail, an inner lead 13i of the conductive pattern 13, are connected to each other, for example, in a wire bonding method for interfacing transmission of signals by using a bond wire 18d, as illustrated in FIG. 2, or in a conductive bump method for interfacing transmission of signals by using a conductive bump (not shown) provided between the semiconductor chip IC and the conductive pattern 13.

The semiconductor chip IC and the conductive pattern 13 are connected to the reinforcing plate 11 that provides floating ground, by using a ground wire 18g. Accordingly, the semiconductor chip IC and the conductive pattern 13 may share a common ground voltage by being electrically connected to each other via the reinforcing plate 11. The conductive bump may be used instead of the ground wire 18g. A metal plate formed of, for example, aluminum (Al) or copper (Cu) exhibiting superior heat and electric conductivity, may be used as the reinforcing plate 11.

The semiconductor chip IC and the film substrate 15 attached on the reinforcing plate 11 are sealed by a resin molding 16 such as epoxy molding composite (EMC), thereby forming an integrated semiconductor package. The resin molding 16 seals the semiconductor chip and a bonding portion between the semiconductor chip IC and the inner lead 13i and insulates and protects the sealed portions from an external environment. A plate layer 13c using tin (Sn), for example, is formed on a surface of the conductive pattern 13 to prevent corrosion.

Figure 3:
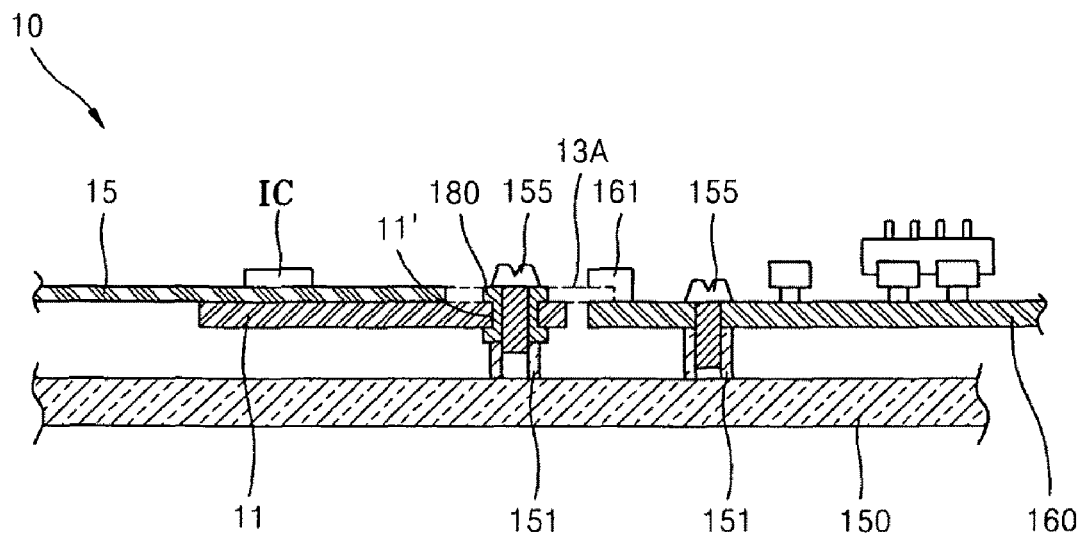
FIG. 3 is a vertical cross-section illustrating the mounting structure of the semiconductor package taken along line of FIG. 1.

FIG. 3 is a vertical cross-section illustrating the mounting structure of the semiconductor package 10 taken along line of FIG. 1. Referring to FIG. 3, the semiconductor package 10 is mounted on a chassis 150 as the semiconductor package 10 is inserted in a coupling boss 151 protruding from a surface of the chassis 150 and fixed on the chassis 150 by using a screw member 155 coupled to the coupling boss 151. The insulating member 180 is inserted in the coupling hole 11' that the screw member 155 penetrates. The insulating member 180 may be a hollow member surrounding an inner wall of the coupling hole 11' and having a sectional shape of a hollow "I" (I-shape) covering portions around the coupling hole 11' on the upper and lower surfaces of the reinforcing plate 11. Since the insulating member 180 is inserted between the reinforcing plate 11 and the screw member 155 and contacts the coupling boss 151 after the insulating member 180 is inserted, the reinforcing plate 11 is insulated from the screw member 155 and the coupling boss 151, and further from the chassis 150 having a coupling relationship with the coupling boss 151 and the chassis 150.

In general, the coupling boss 151 is integrally formed with the chassis 150 that is formed of a metal material and thus exhibits electrical conductivity. Also, the screw member 155 coupled to the coupling boss 151 may exhibit electrical conductivity. Thus, since the reinforcing plate 11 providing floating ground is insulatively assembled by using the insulating member 180, a ground electric potential may be maintained constant and an internal circuit of the semiconductor package may be prevented from being damaged by electric short-circuit with the chassis 150.

A circuit board 160 is mounted at another position on the chassis 150. The circuit board 160 may be mounted on the chassis 150 by using the coupling boss 151 and then fixed by the screw member 155 coupled to the coupling boss 151. The input wiring 13A forming one end of the film substrate 15 is inserted in a connector 161 formed on the circuit board 160. The input wiring 13A of the film substrate 15 and a terminal of the circuit board 160 are connected to each other by using the connector 161. Thus, drive signals generated from the circuit board 160 are transferred to the semiconductor chip IC and converted by the internal circuit of the semiconductor chip IC. The converted drive signals may be output to a display panel, for example, through the output wiring 13B forming the other end of the film substrate 15.

Figure 4A:
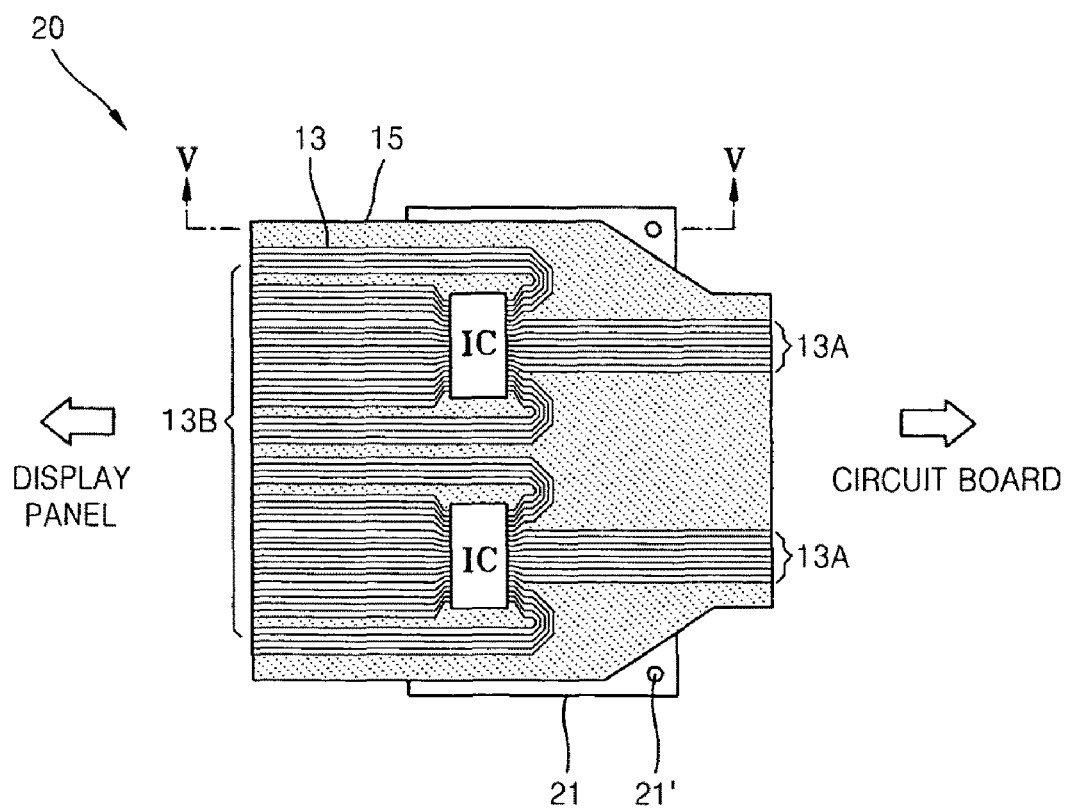
FIG. 4A is a plan view of a semiconductor package according to another embodiment of the present invention.

FIG. 4A is a plan view of a semiconductor package 20 according to another embodiment of the present invention. Referring to FIG. 4A, in the semiconductor package 20, the film substrate 15 on which a plurality of conductive patterns 13 are formed substantially in the lengthwise direction and a reinforcing plate 21 supporting the film substrate 15 are arranged to face each other. The semiconductor chip IC making electric connection to the conductive patterns 13 is mounted on the reinforcing plate 21. In particular, in the semiconductor package 20 according to the present embodiment, a double-sided PCB is used instead of a metal plate, as the reinforcing plate 21 supporting the film substrate 15.

Figure 4B:
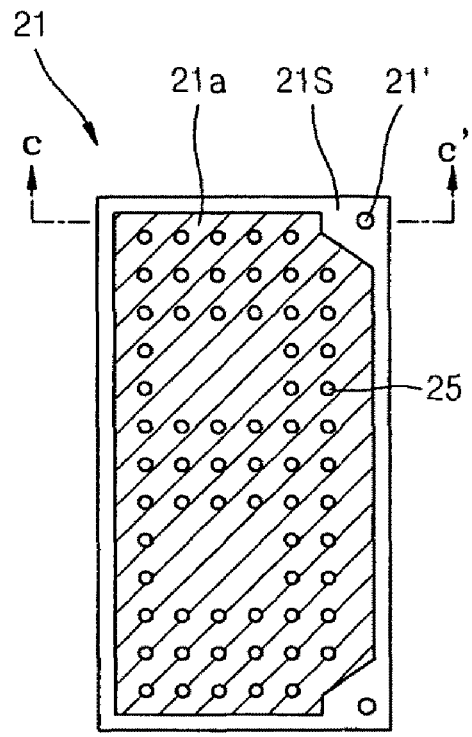
FIG. 4B is a plan view of the reinforcing plate of FIG. 4A.
Figure 4C:
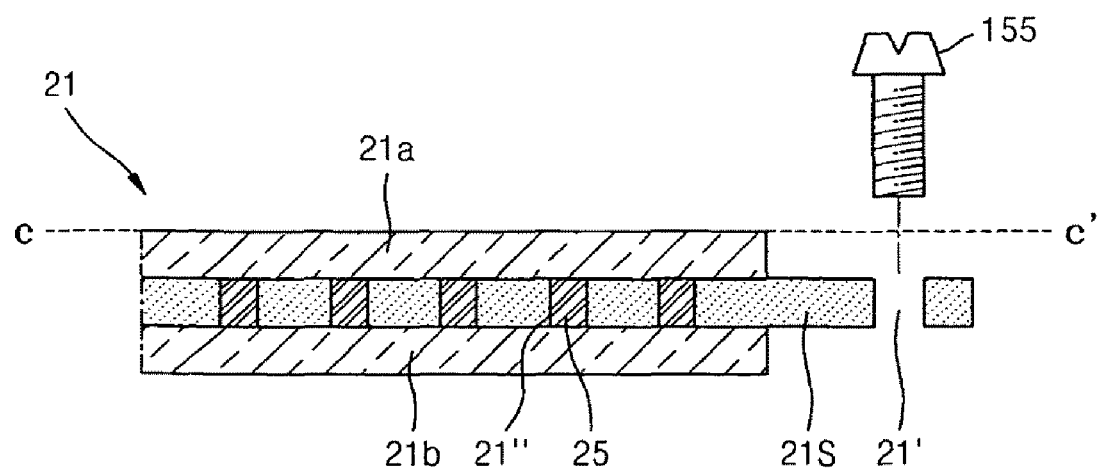
FIG. 4C is a vertical cross-section of the reinforcing plate taken along line C-C' of FIG. 4B.

FIG. 4B is a plan view of the reinforcing plate 21 of FIG. 4A. FIG. 4C is a vertical cross-section of the reinforcing plate 21 taken along line C-C' of FIG. 4B. Referring to FIGS. 4B and 4C, the reinforcing plate 21 embodied by a double-sided PCB has a multilayer structure in which first and second metal layers 21a and 21b are formed on both of the upper and lower surfaces of an insulation substrate 21S. A plurality of via holes 21" penetrating the insulation substrate 21S are formed at a plurality of positions in reinforcing plate 21. The first and second metal layers 21a and 21b are connected to each other by using a conductive filler 25 filling the via holes 21". The coupling hole 21' may be formed in an at least one corner of the reinforcing plate 21. The reinforcing plate 21 may be mounted on a chassis (not shown) by using the screw member 155 penetrating the coupling hole 21' and coupled to the chassis. Since the screw member 155 inserted in the coupling hole 21' generally exhibits electrical conductivity, the insulating substrate 21S, excluding the first and second metal layers 21a and 21b, is exposed at the position where the coupling hole 21' is formed. Thus, the screw member 155 makes insulation contact with the insulation substrate 21S. As described below, this is to prevent the first and second metal layers 21a and 21b and the chassis from being electrically short-circuited via the screw member 155 and to maintain the ground electric potential constant so that the internal circuit of the semiconductor chip IC may be protected.

Figure 5A:
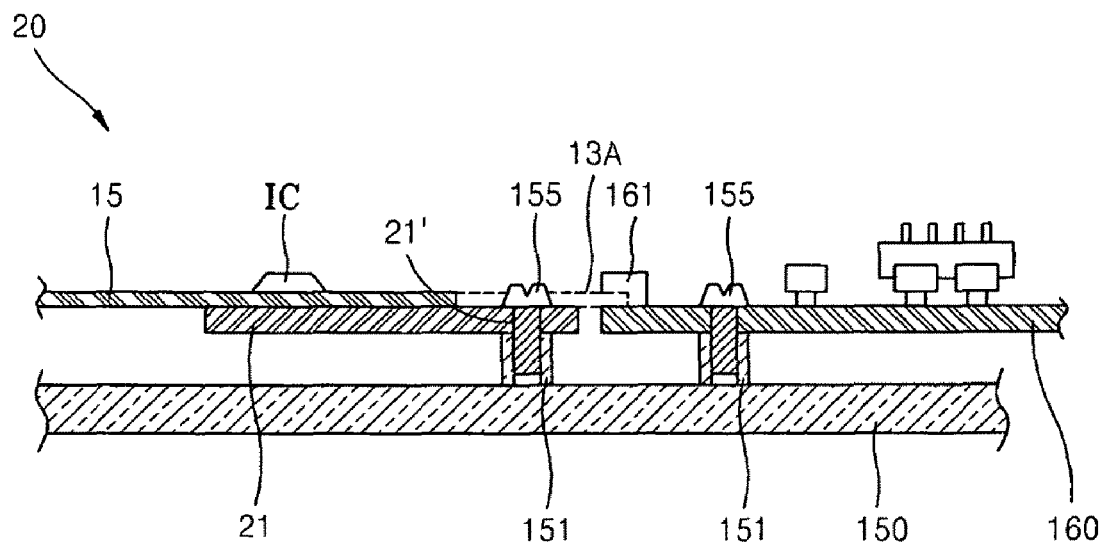
FIG. 5A is a vertical cross-section illustrating the mounting structure of a semiconductor package according to another embodiment of the present invention.

FIG. 5A illustrates the mounting structure of a semiconductor package according to another embodiment of the present invention. FIG. 5A is a vertical cross-section taken along line V-V of FIG. 4A, illustrating the structure in which the semiconductor package 20 of FIG. 4A is mounted on the chassis 150. Referring to FIG. 5A, the semiconductor package 20 includes the reinforcing plate 21 as a support structure, the semiconductor chip IC arranged on the reinforcing plate 21 and making electrical connection with the reinforcing plate 21, and the film substrate 15. The semiconductor package 20 is fixed to the chassis 150 by using the coupling boss 151 protruding from the chassis 150 and the screw member 155 coupled to the coupling boss 151 with the semiconductor package 20 interposed between the coupling boss 151 and the screw member 155. Another coupling boss 151 protrudes from the chassis 150 at a position neighboring the semiconductor package 20. The circuit board 160 is fixed to the chassis 150 by using the screw member 155 that is coupled to the coupling boss 151. The circuit board 160 as a signal generation source may supply an electric signal to the input wiring 13A of the semiconductor package 20 by using the connector 161.

Figure 5B:
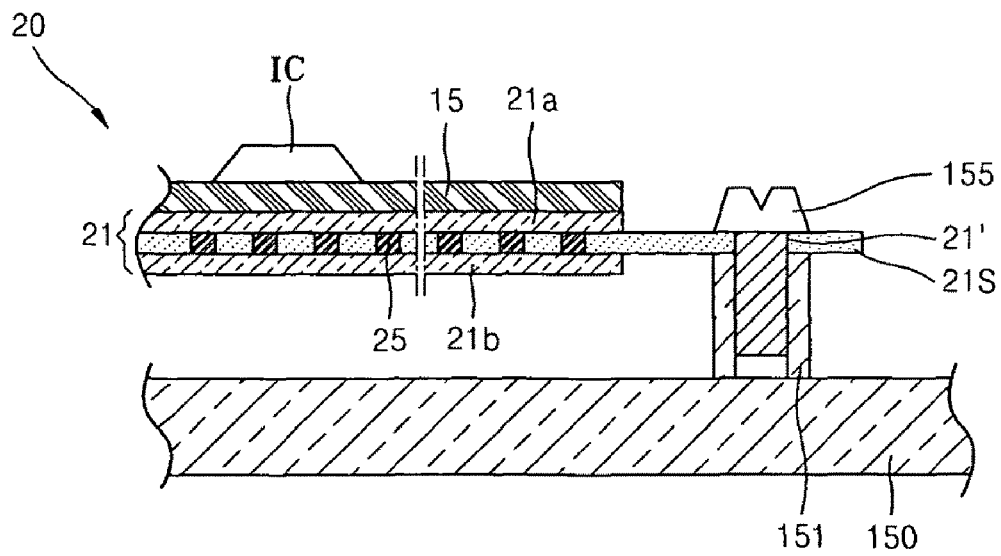
FIG. 5B is a vertical cross-section illustrating the mounting structure of FIG. 5A.

FIG. 5B is a vertical cross-section illustrating the mounting structure of FIG. 5A. Referring to FIG. 5B, the reinforcing plate 21 having a double-sided PCB shape has a sandwich structure including the first and second metal layers 21a and 21b which are respectively arranged on the upper and lower surfaces of the insulation substrate 21S. The first and second metal layers 21a and 21b has a main purpose to dissipate heat of the semiconductor chip IC, rather than electric connection for interfacing transmission of signals. The first metal layer 21a and the second metal layer 21b are thermally connected to each other by using the conductive filler 25 formed by penetrating the insulation substrate 21S. The conductive filler 25 fills the via holes 21" and forms a heat dissipation path between the first and second metal layers 21a and 21b. The conductive filler 25 may be formed of a metal material exhibiting a superior heat conductivity, such as copper (Cu) and aluminum (Al). For example, operation heat generated during the driving of the semiconductor chip IC is transferred to the first metal layer 21a of the reinforcing plate 21, and then, to the second metal layer 21b of the reinforcing plate 21 via the conductive filler 25. Finally, the heat may be dissipated to the outer atmosphere from the surface of the second metal layer 21b by convective heat transfer.

In addition to the function as a heat dissipation plate of the semiconductor chip IC, the reinforcing plate 21 may provide floating ground to the whole semiconductor package 20. That is, with the structure similar to one illustrated in FIG. 2, the semiconductor chip IC and the film substrate 15 are directly grounded to the first metal layer 21a forming the surface of the reinforcing plate 21 via the ground wire 18g. Accordingly, the semiconductor chip IC and the film substrate 15 share common ground electric potential via the first metal layer 21a. Since the first metal layer 21a is electrically connected to the second metal layer 21b via the conductive filler 25, a sufficient amount of capacitance is supplied by the first and second metal layers 21a and 21b so that a predetermined level of ground electric potential may be maintained. The reinforcing plate 21 supplying the floating ground is insulatively assembled on the chassis 150 in the following manner. That is, as the first and second metal layers 21a and 21b are removed around the coupling hole 21' to expose the insulation substrate 21S and the screw member 155 inserted in the coupling hole 21' insulatively contacts the exposed insulation substrate 21S, the reinforcing plate 21 may be insulated from the coupling boss 151 or the chassis 150.

Figure 6A:
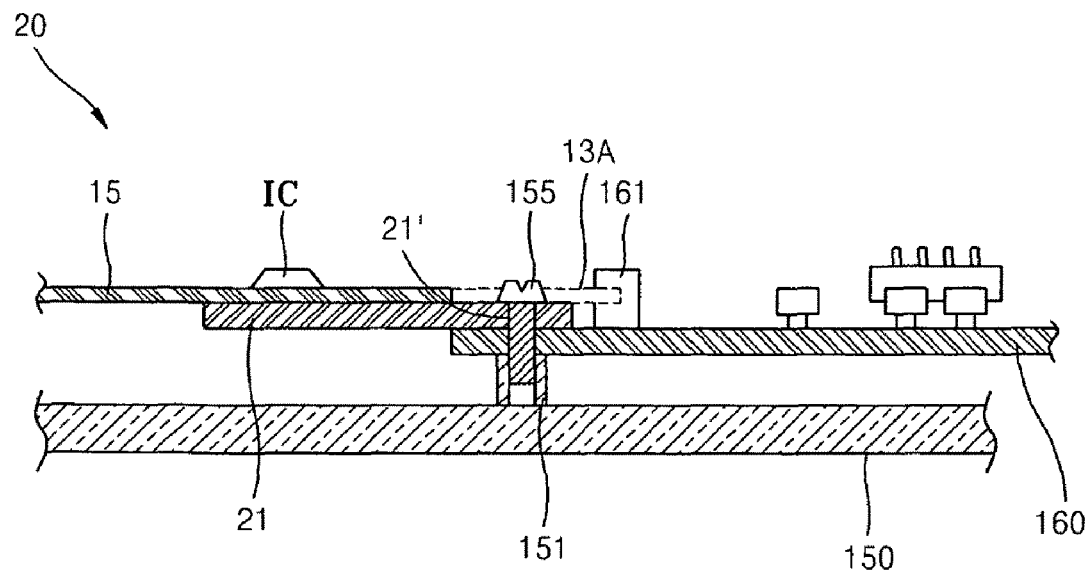
FIG. 6A is a vertical cross-section illustrating the mounting structure of a semiconductor package according to another embodiment of the present invention.

FIG. 6A is a vertical cross-section illustrating the mounting structure of a semiconductor package according to another embodiment of the present invention. Referring to FIG. 6A, the reinforcing plate 21 on which the film substrate 15 is attached is arranged on the coupling boss 151 protruding from the chassis 150. The reinforcing plate 21 is fixed on the chassis 150 by using the screw member 155 that is assembled to the coupling boss 151 with the reinforcing member 21 interposed between the screw member 155 and the coupling boss 151. The circuit board 160 as a signal generation source is mounted on the chassis 150 by using the same coupling boss 151. As illustrated in FIG. 6A, the reinforcing plate 21 and the circuit board 160 are arranged to overlap each other. As the screw member 155 penetrates the reinforcing plate 21 and the circuit board 160 and is screw coupled to the coupling boss 151, the reinforcing plate 21 and the circuit board 160 may be simultaneously fixed. The input wiring 13A forming an end of the film substrate 15 is connected to the circuit board 160 by using the connector 161. A drive signal generated from the circuit board 160 is transferred to the semiconductor chip IC via the wiring of the film substrate 15.

Figure 6B:
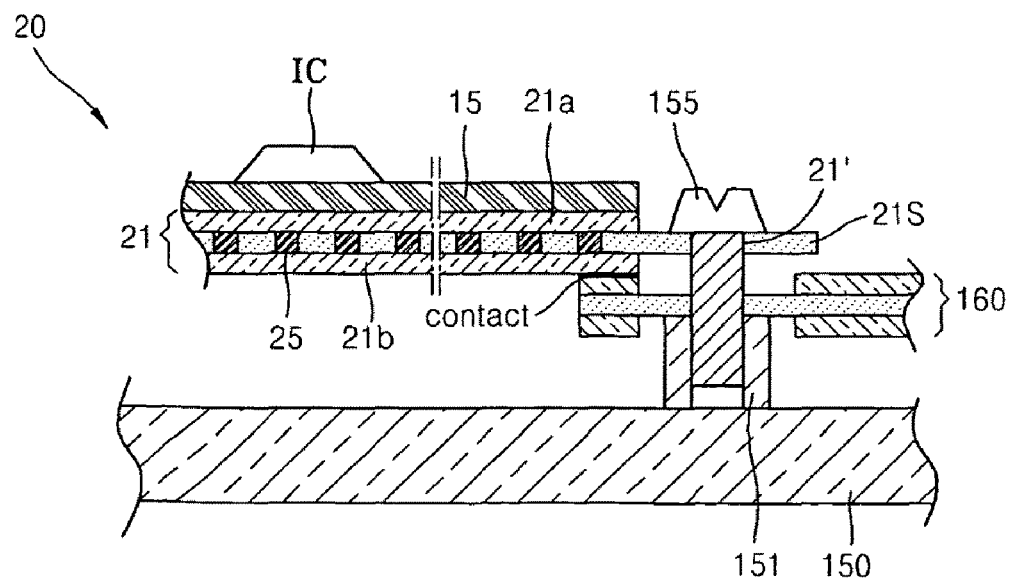
FIG. 6B is a vertical cross-section illustrating the mounting structure of FIG. 6A.

FIG. 6B is a vertical cross-section illustrating the mounting structure of FIG. 6A. Referring to FIG. 6B, the reinforcing plate 21 has a sandwich structure of the first and second metal layers 21a and 21b arranged on the upper and lower surfaces of the insulation substrate 21S. The first and second metal layers 21a and 21b are electrically connected to each other via the conductive filler 25 filling the via holes 21" of FIG. 4C penetrating the insulation substrate 21S. The reinforcing plate 21 and the circuit board 160 are arranged to overlap each other on the coupling boss 151 protruding from the chassis 150 and assembled on the chassis 150 by using the screw member 155 coupled to the coupling boss 151 by penetrating the reinforcing plate 21 and the circuit board 160.

Basically, signals are transferred between the film substrate 15 and the circuit board 160 via the connector 161 formed on the circuit board 160. In the present embodiment, in replacement of or in addition to the connector 161, signals can be transferred without using the connecter 161 as the second metal layer 21b exposed from a rear surface of the reinforcing plate 21 makes conductive contact directly with the exposed wiring of the circuit board 160 by a pressing force of the screw member 155. In this case, by designing the first and second metal layers 21a and 21b, forming the reinforcing plate 21, in connection with the film substrate 15, a predetermined signal may be transmitted to the semiconductor package IC with the cooperation of the patterns of the first and second metal layers 21a and 21b and the wiring of the film substrate 15. For example, a signal transfer line is established from the exposed wiring of the circuit board 160 to the semiconductor chip IC via the pattern of the second metal layer 21b, the conductive filler 25, and the pattern of the first metal layer 21a of the reinforcing plate 21 and the wiring of the film substrate 15 arranged on the reinforcing plate 21.

The method of connecting the reinforcing plate 21 and the circuit board 160 in a direct conductive contact manner may be used together with or in replacement of the method using the connector 161. According to the method using the connector 161 in which a plurality of pins are integrated, connection resistance increases between the film substrate 15 and the circuit board 160 due to a small contact area of the connector 161. In the proposed structure, since the wiring of the reinforcing plate 21, in particular, the second metal layer 21b, and the circuit board 160 can be directly contacted in a large area, electrical contact resistance can be reduced. As illustrated in FIG. 6B, since the number of pins of the connector 161 can be reduced as the reinforcing plate 21 directly contacts the circuit board 160 in the method of simultaneously using the connector 161, the contact resistance can be reduced as well.

Figure 7:
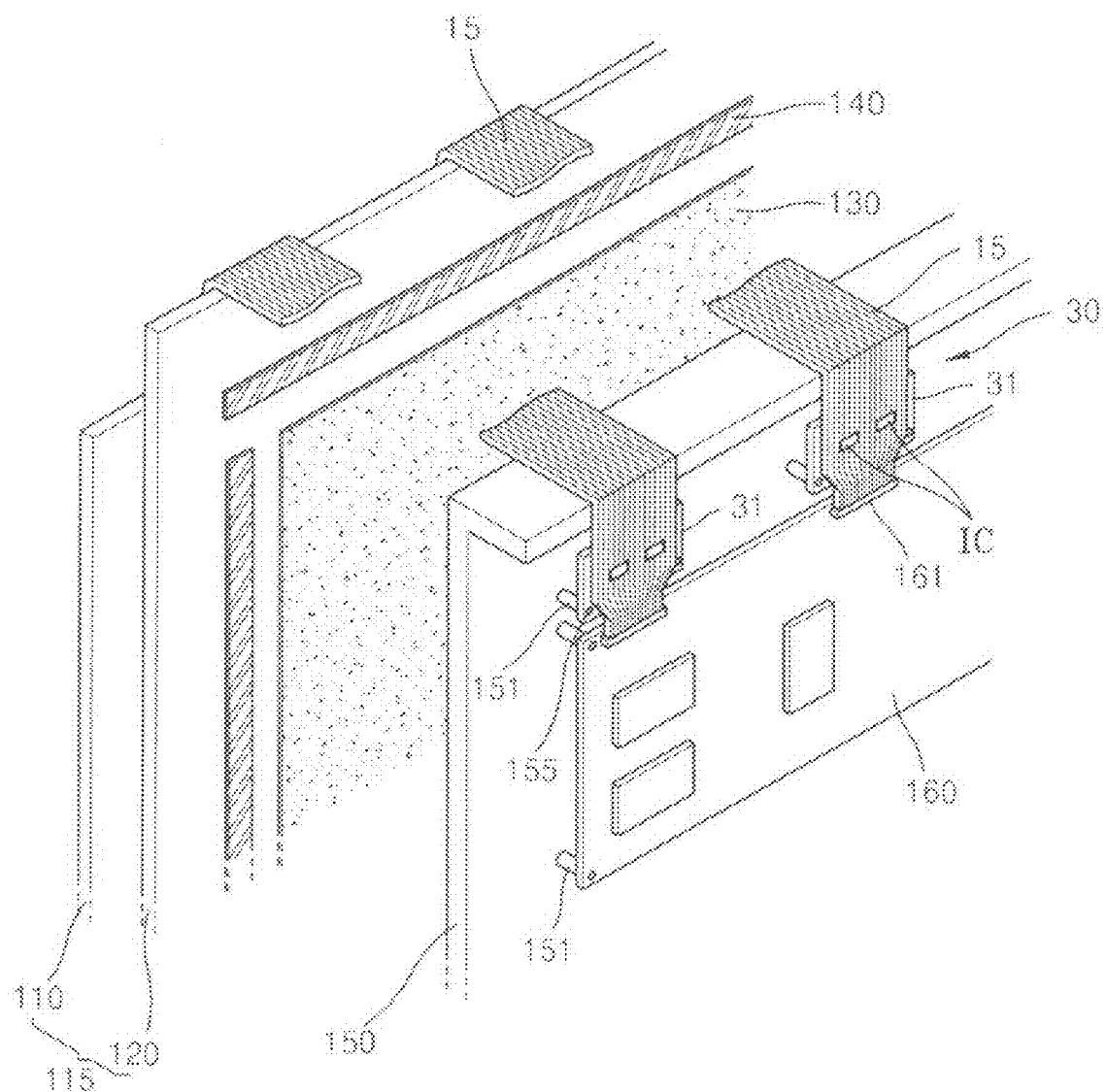
FIG. 7 is an exploded perspective view of a plasma display device according to an embodiment of the present invention.

FIG. 7 is an exploded perspective view of a plasma display device according to an embodiment of the present invention. Referring to FIG. 7, a plasma display device according to the present embodiment includes a plasma display panel 115 for forming a predetermined image by using gas discharge, the chassis 150 structurally supporting the plasma display panel 115 and on which a plurality of circuit boards 160 for driving the plasma display panel 115 are mounted, and a semiconductor package 30 for the signal conversion and transfer between the circuit boards 160 and the plasma display panels 115. The plasma display panel 115 includes a front panel 110 and a rear panel 120 coupled to face each other. Although it is not illustrated in FIG. 7, a partition wall for sectioning a plurality of discharge cells is formed in the front panel 110 and/or the rear panel 120 and a plurality of discharge electrodes to generate discharge are formed in each of the discharge cells. A terminal portion of each discharge electrode is connected to the film substrate 15 and receives a predetermined drive signal.

The chassis 150 structurally supports the plasma display panel 115 that is weak to external shocks and simultaneously dissipates heat generated by the plasma display panel 115. The chassis 150 may have a mounting surface for mounting the circuit boards 160 and the semiconductor package 30 to drive the plasma display panel 115. To this end, a plurality of coupling bosses 151 may protrude from the rear surface of the chassis 150. The plasma display panel 115 and the chassis 150 may be coupled to each other by applying a predetermined pressure to each other and with a thermal conductive sheet 130 and an adhesive tape 140 interposed between the plasma display panel 115 and the chassis 150.

The semiconductor package 30 includes at least one semiconductor chip IC, the film substrate 15 providing a wiring of the semiconductor chip IC, and a reinforcing plate 31 providing a mounting structure and to which the film substrate 15 and the semiconductor chip IC are attached. The semiconductor package 30 may be fixed to the chassis 150 as the screw member 155 inserted in a coupling hole formed in a corner of the reinforcing plate 31 is screw coupled to the coupling boss 151 protruding from the chassis 150. The semiconductor package 30, in particular, the semiconductor chip IC, uses the connector 161 formed on the circuit board 160, converts an input signal from the circuit board 160 to a predetermined drive signal, and supplies a converted drive signal to the plasma display panel 115. The detailed embodiment of the semiconductor package 30 and the mounting structure thereof are the same as those described with reference to FIGS. 1-6 and all the mounting structure of the semiconductor package according to the above-described embodiments may be applied. A redundant description thereof will be omitted herein.

As described above, according to the mounting structure of the present invention, the insulation coupling between the semiconductor package and the chassis is guaranteed so that pioneer technology supporting a new semiconductor package may be provided. In particular, the mounting structure supports the application of the semiconductor package providing floating ground by itself so that reliability of products may be improved based on stability in ground.

Also, while achieving the above effect, the present invention establishes a signal transfer line using direct conductive contact between the semiconductor package and the circuit board so that additional effect of reducing contact resistance between the semiconductor package and the circuit board may be achieved, compared to the conventional connection method using the connector only.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display device, comprised of:
a mounting structure of a semiconductor package, comprising:
the semiconductor package comprising:
a reinforcing plate having a coupling hole;
a substrate directly attached to the reinforcing plate, the substrate interfacing transmission of signals between a circuit board and a display panel; and
a semiconductor chip directly attached to the reinforcing plate, the semiconductor chip forming an electrical contact point with the substrate;
a chassis having a coupling boss protruding at a position corresponding to the coupling hole;
a coupling member penetrating the coupling hole and coupled to the coupling boss; and
an insulation member covering around the coupling hole of the reinforcing plate and making insulation contact with the coupling member and the coupling boss.

2. The display device of claim 1, wherein the insulation member covers around the coupling hole on a surface of the reinforcing plate.

3. The display device of claim 1, wherein the insulation member extends from a surface of the reinforcing plate in a direction along a thickness of the reinforcing plate and surrounds an inner wall of the coupling hole.

4. The display device of claim 1, wherein the insulation member is a hollow member having a sectional shape of a hollow I-shape.

5. The display device of claim 1, wherein the reinforcing plate provides floating ground of the semiconductor chip and functions as a heat dissipation plate of the semiconductor chip.

6. A display device comprised of: a mounting structure of a semiconductor package, comprising: a semiconductor package comprising:
a reinforcing plate comprising:
a first metal layer;
a second metal layer; and
an insulation substrate disposed between the first and second metal layers, the reinforcing plate having a coupling hole, at a location absent of and spaced-apart from the first and second metal layers;
a substrate directly attached to the reinforcing plate, the substrate interfacing transmission of signals between a circuit board and a display panel; and
a semiconductor chip directly attached to the reinforcing plate, the semiconductor chip an electrical contact point with the substrate;
a chassis having a coupling boss protruding at a position corresponding to the coupling hole; and
a coupling member penetrating the coupling hole and coupled to the coupling boss.

7. The display device of claim 6, wherein a plurality of via holes are formed in the insulation substrate and each of the via holes is filled with a conductive filler connecting the first and second metal layers on both surfaces of the insulation substrate.

8. The display device of claim 6, wherein the reinforcing plate and the circuit board are arranged to overlap each other such that the coupling hole of the reinforcing plate and a coupling hole formed on the circuit board are aligned to the coupling boss of the chassis, and fixed together by using the coupling member penetrating each of the coupling holes and coupled to the coupling boss.

9. The display device of claim 8, wherein the reinforcing plate and the circuit board arranged to overlap each other form a signal transfer line through a conductive contact portion.

10. The display device of claim 9, wherein the first or second metal layer of the reinforcing plate and an exposed wiring of the circuit board make conductive contact with each other.

11. A display device comprising:
a plasma display panel forming an image by using gas discharge;
at least one circuit board generating a drive signal for the plasma display panel;
a semiconductor package comprising:
a reinforcing plate having a coupling hole;
a substrate directly attached to the reinforcing plate, the substrate interfacing transmission of signals between the circuit board and the plasma display panel; and
a semiconductor chip directly attached to the reinforcing plate, the semiconductor chip forming an electrical contact point with the substrate;

a chassis having a coupling boss protruding at a position corresponding to the coupling hole;

a coupling member penetrating the coupling hole and coupled to the coupling boss; and an insulation member covering around the coupling hole of the reinforcing plate and making insulation contact with the coupling member and the coupling boss.

12. The display device of claim 11, wherein the insulation member covers around the coupling hole on a surface of the reinforcing plate.

13. The display device of claim 11, wherein the insulation member extends from a surface of the reinforcing plate in a direction along a thickness of the reinforcing plate and surrounds an inner wall of the coupling hole.

14. The display device of claim 11, wherein the insulation member is a hollow member having a sectional shape of a hollow I-shape.

15. The display device of claim 11, wherein the reinforcing plate provides floating ground of the semiconductor chip and functions as a heat dissipation plate of the semiconductor chip.

16. A display device comprising:

a plasma display panel forming an image by using gas discharge;

at least one circuit board generating a drive signal for the plasma display panel;

a semiconductor package comprising:
   a reinforcing plate comprising:
      a first metal layer;
      a second metal layer; and
      an insulation substrate disposed between the first and second metal layers, the reinforcing plate having a coupling hole, the insulation substrate being exposed around the coupling hole;
   a substrate directly attached to the reinforcing plate, the substrate interfacing transmission of signals between the circuit board and the plasma display panel; and
   a semiconductor chip directly attached to the reinforcing plate, the semiconductor chip forming an electrical contact point with the substrate;

a chassis having a coupling boss protruding at a position corresponding to the coupling hole; and a coupling member penetrating the coupling hole and coupled to the coupling boss.

17. The display device of claim 16, wherein a plurality of via holes are formed in the insulation substrate and each of the via holes is filled with a conductive filler connecting a surface of the insulation substrate and the first and second metal layers on both surfaces of the insulation substrate.

18. The display device of claim 16, wherein the reinforcing plate and the circuit board are arranged to overlap each other such that the coupling hole of the reinforcing plate and a coupling hole formed on the circuit board are aligned to the coupling boss of the chassis, and fixed together by using the coupling member penetrating each of the coupling holes and coupled to the coupling boss.

19. The display device of claim 18, wherein the reinforcing plate and the circuit board arranged to overlap each other form a signal transfer line through a conductive contact portion.

20. The display device of claim 19, wherein the first or second metal layer of the reinforcing plate and an exposed wiring of the circuit board make conductive contact with each other.

* * * * *